United States Patent
Ishizone et al.

(10) Patent No.: US 7,916,436 B2
(45) Date of Patent: Mar. 29, 2011

(54) TUNNELING MAGNETIC SENSOR INCLUDING PLATINUM LAYER AND METHOD FOR PRODUCING THE SAME

(75) Inventors: Masahiko Ishizone, Niigata-ken (JP); Naoya Hasegawa, Niiata-ken (JP); Masamichi Saito, Niigata-ken (JP); Yosuke Ide, Niigata-ken (JP); Ryo Nakabayashi, Niigata-ken (JP); Kazumasa Nishimura, Niigata-ken (JP)

(73) Assignee: TDK Corporation, Tokyo (JP)

( * ) Notice: Subject to any disclaimer, the term of this patent is extended or adjusted under 35 U.S.C. 154(b) by 907 days.

(21) Appl. No.: 11/890,086

(22) Filed: Aug. 3, 2007

(65) Prior Publication Data
US 2008/0291586 A1 Nov. 27, 2008

(30) Foreign Application Priority Data
Sep. 11, 2006 (JP) .................................. 2006-245410

(51) Int. Cl.
*G11B 5/33* (2006.01)
(52) U.S. Cl. .................................................... 360/324.2
(58) Field of Classification Search ............... 360/324.2, 360/324.12, 324.1, 324.11
See application file for complete search history.

(56) References Cited

U.S. PATENT DOCUMENTS

| 2002/0097539 A1* | 7/2002 | Hasegawa et al. ........ 360/324.11 |
| 2005/0219770 A1* | 10/2005 | Gill ............................ 360/324.2 |
| 2008/0074805 A1* | 3/2008 | Ikarashi et al. ............ 360/324.2 |
| 2008/0123223 A1* | 5/2008 | Ide et al. .................... 360/324.2 |
| 2008/0253038 A1* | 10/2008 | Nakabayashi et al. ..... 360/324.2 |

FOREIGN PATENT DOCUMENTS

JP 2000-091666 3/2000
JP 2000-322714 11/2000

* cited by examiner

*Primary Examiner* — Allen T Cao
(74) *Attorney, Agent, or Firm* — Brinks Hofer Gilson & Lione

(57) ABSTRACT

A tunneling magnetic sensor includes a platinum layer between a pinned magnetic layer and an insulating barrier layer. The platinum layer can probably vary the barrier height (potential height) and barrier width (potential width) of the insulating barrier layer to reduce the absolute value of VCR, thus providing higher operating stability than known tunneling magnetic sensors. In addition, the insulating barrier layer can achieve increased flatness at its bottom interface (where the insulating barrier layer starts to be formed). The tunneling magnetic sensor can therefore provide a higher rate of resistance change (ΔR/R) at low RA than known tunneling magnetic sensors.

13 Claims, 11 Drawing Sheets

TUNNELING MAGNETIC SENSOR INCLUDING PLATINUM LAYER AND METHOD FOR PRODUCING THE SAME

CLAIM OF PRIORITY

This application claims benefit of the Japanese Patent Application No. 2006-245410, filed Sep. 11, 2006, which is hereby incorporated by reference.

BACKGROUND OF THE INVENTION

1. Field of the Invention

The present invention relates to magnetic sensors utilizing a tunneling effect for use in magnetic sensing apparatuses such as magnetic playback apparatuses, including hard disk drives. In particular, the invention relates to a tunneling magnetic sensor capable of providing a reduced absolute value of VCR (voltage coefficient of resistance), low RA (the product of sensor resistance, R, and sensor area, A), and a high rate of resistance change ($\Delta R/R$) and a method for producing such a tunneling magnetic sensor.

2. Description of the Related Art

A tunneling magnetic sensor (tunneling magnetoresistive element), which utilizes a tunneling effect to cause a resistance change, includes a pinned magnetic layer, a free magnetic layer, and an insulating barrier layer (tunneling barrier layer) disposed therebetween. If the magnetization of the free magnetic layer is antiparallel to that of the pinned magnetic layer, a tunneling current flowing through the insulating barrier layer is minimized, meaning that the resistance is maximized. If the magnetization of the free magnetic layer is parallel to that of the pinned magnetic layer, the tunneling current is maximized, meaning that the resistance is minimized.

Based on this principle, a change in electrical resistance is detected as a voltage change when an external magnetic field changes the magnetization of the free magnetic layer. The tunneling magnetic sensor thus senses a leakage magnetic field from a recording medium.

Japanese Unexamined Patent Application Publication Nos. 2000-91666 (Patent Document 1) and 2000-322714 (Patent Document 2) disclose inventions related to tunneling magnetic sensors.

The inventions disclosed in Patent Documents 1 and 2 are directed to the prevention of oxidation of magnetic layers.

It has been found that the use of titanium oxide (Ti—O) for the insulating barrier layer extremely increases the absolute value of VCR, a measure of the dependence of sensor resistance on voltage change. Higher absolute values of VCR are disadvantageous because they result in larger variations in sensor resistance and decreased operating stability (unstable operation). Accordingly, an improvement for reducing the absolute value of VCR is demanded.

In addition, a high rate of resistance change ($\Delta R/R$) should be provided within a low range of RA. High RA causes problems such as difficulty of high-speed data transmission, and a low rate of resistance change ($\Delta R/R$) poses the difficulty of increasing output.

In the inventions disclosed in Patent Documents 1 and 2, the insulating barrier layer is formed of aluminum oxide (magnesium oxide is also disclosed in Patent Document 2), rather than being formed of titanium oxide.

Hence, the above problem associated with the use of an insulating barrier layer formed of titanium oxide is not recognized in the inventions disclosed in Patent Documents 1 and 2, which of course disclose no method for improving the above characteristics, namely, VCR, RA, and the rate of resistance change ($\Delta R/R$).

SUMMARY OF THE INVENTION

Accordingly, the present invention provides a tunneling magnetic sensor including a Ti—O insulating barrier layer and capable of providing a reduced absolute value of VCR, low RA, and a high rate of resistance change ($\Delta R/R$) and a method for producing such a tunneling magnetic sensor.

The present invention provides a tunneling magnetic sensor including, from bottom to top, a first magnetic layer, an insulating barrier layer formed of Ti—O, and a second magnetic layer. One of the first and second magnetic layers is a pinned magnetic layer whose magnetization direction is fixed, and the other magnetic layer is a free magnetic layer whose magnetization direction is changed by an external magnetic field. The free magnetic layer includes a soft magnetic layer and an enhancement layer disposed between the soft magnetic layer and the insulating barrier layer. A platinum layer is disposed in at least one of positions between the insulating barrier layer and the first magnetic layer, between the insulating barrier layer and the second magnetic layer, and between the soft magnetic layer and the enhancement layer.

This tunneling magnetic sensor can achieve a lower absolute value of VCR than known tunneling magnetic sensors to suppress variations in sensor resistance with voltage change, thus providing improved operating stability.

The absolute value of VCR can be reduced probably because the platinum layer disposed in the predetermined position described above varies the barrier height (potential height) and barrier width (potential width) of the insulating barrier layer.

In the present invention, the platinum layer is preferably disposed at least between the insulating barrier layer and the first magnetic layer to provide a high rate of resistance change ($\Delta R/R$) at low RA in addition to the effect of reducing the absolute value of VCR. Such a high rate of resistance change ($\Delta R/R$) can be provided probably because the insulating barrier layer achieves increased flatness at its bottom interface and thus has a more uniform thickness than before to reduce a leakage current flowing through thin portions resulting from unevenness in thickness. Such a leakage current does not contribute to resistance change.

In the present invention, the platinum layer preferably has a thickness of more than about 0 Å to 4 Å, more preferably about 0.4 to 2 Å, still more preferably about 1 to 2 Å, to more reliably provide a higher rate of resistance change ($\Delta R/R$) than known tunneling magnetic sensors including no platinum layer.

In the present invention, the insulating barrier layer may be formed of titanium magnesium oxide (Ti—Mg—O) instead of Ti—O to facilitate the effect of reducing the absolute value of VCR and to provide a high rate of resistance change ($\Delta R/R$) at low RA.

In the present invention, the tunneling magnetic sensor can be configured such that interdiffusion of constituent elements at interfaces between the platinum layer and the upper and lower layers facing each other with the platinum layer disposed therebetween forms such a concentration gradient that the platinum concentration decreases gradually from inside the platinum layer to inside the upper and lower layers.

In the present invention, preferably, the first magnetic layer is the pinned magnetic layer, and the second magnetic layer is the free magnetic layer. According to experiments described later, such a structure can reduce the absolute value of VCR and provide a high rate of resistance change (ΔR/R) at low RA.

In the present invention, preferably, the enhancement layer is formed of a CoFe alloy, and the soft magnetic layer is formed of a NiFe alloy. According to the experiments described later, such a structure can reduce the absolute value of VCR and provide a high rate of resistance change (ΔR/R) at low RA.

The present invention further provides a method for producing a tunneling magnetic sensor including, from bottom to top, a first magnetic layer, an insulating barrier layer formed of Ti—O, and a second magnetic layer. One of the first and second magnetic layers is a pinned magnetic layer whose magnetization direction is fixed, and the other magnetic layer is a free magnetic layer whose magnetization direction is changed by an external magnetic field. The free magnetic layer includes a soft magnetic layer and an enhancement layer disposed between the soft magnetic layer and the insulating barrier layer. The method includes the steps of (a) forming the first magnetic layer; (b) forming the insulating barrier layer on the first magnetic layer; (c) forming the second magnetic layer on the insulating barrier layer; and (d) forming a platinum layer in at least one of positions between the first magnetic layer and the insulating barrier layer, between the insulating barrier layer and the second magnetic layer, and between the soft magnetic layer and the enhancement layer.

The method allows easy, successful production of a tunneling magnetic sensor having improved operating stability with a lower absolute value of VCR than known tunneling magnetic sensors and suppressed variations in sensor resistance with voltage change.

Preferably, the method further includes the step of subjecting a surface of the first magnetic layer to plasma treatment between the steps (a) and (b), and the step (d) is performed after the plasma treatment if the platinum layer is formed between the first magnetic layer and the insulating barrier layer. The plasma treatment allows formation of the insulating barrier layer on a surface with excellent flatness, so that the insulating barrier layer can achieve a more uniform thickness. The method thus allows easy, successful production of a tunneling magnetic sensor having a high rate of resistance change (ΔR/R) at low RA.

In the present invention, the platinum layer is preferably formed to a thickness of more than about 0 Å to 4 Å, more preferably about 0.4 to 2 Å, to more reliably provide a higher rate of resistance change (ΔR/R) than known tunneling magnetic sensors including no platinum layer.

In the present invention, the insulating barrier layer may be formed of Ti—Mg—O instead of Ti—O in the step (b) to facilitate the effect of reducing the absolute value of VCR and to provide a high rate of resistance change (ΔR/R) at low RA.

As described above, a tunneling magnetic sensor including an insulating barrier layer formed of titanium oxide has a lower absolute value of VCR than known tunneling magnetic sensors, thus providing improved operating stability. In addition, the tunneling magnetic sensor can provide a high rate of resistance change (ΔR/R) at low RA.

DESCRIPTION OF THE PREFERRED EMBODIMENTS

Figure 1:
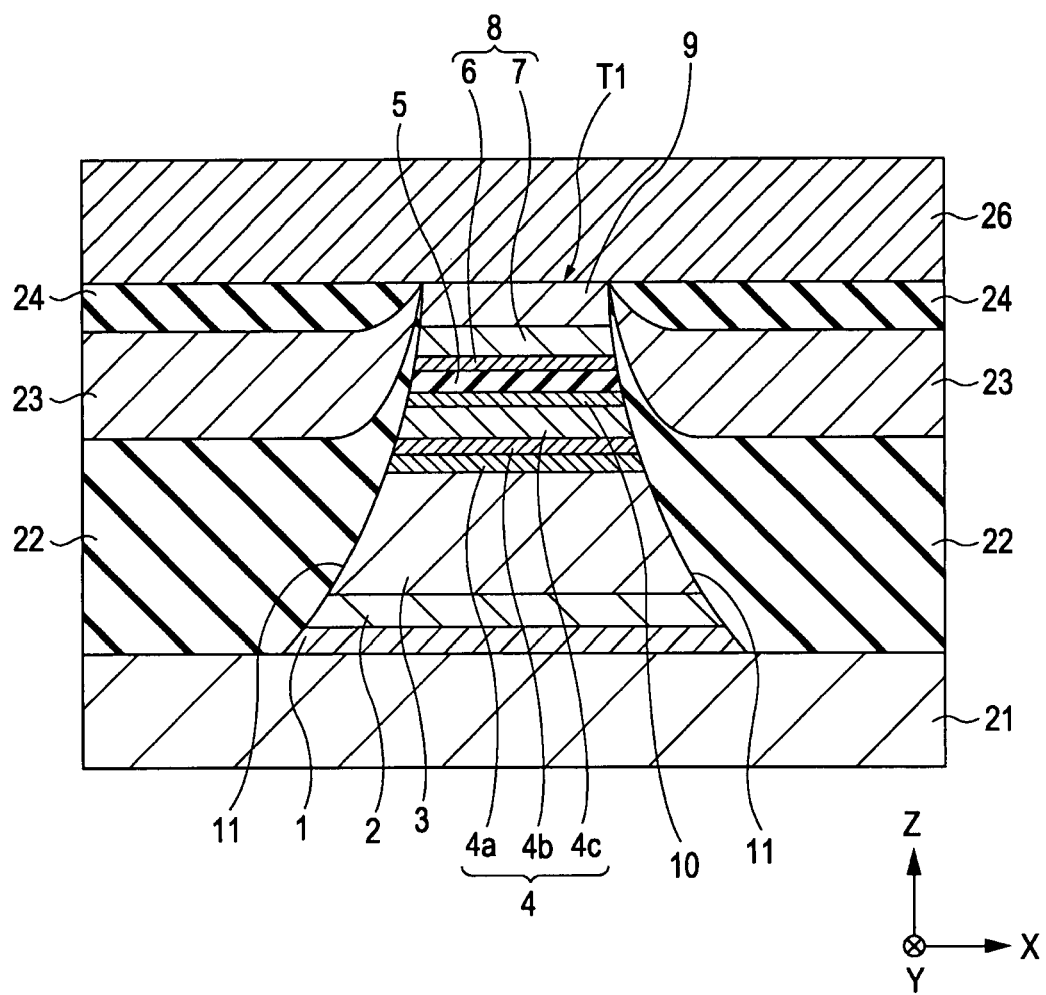
FIG. 1 is a sectional view of a tunneling magnetic sensor according to an embodiment which is taken in a direction parallel to a surface of the magnetic sensor opposite a recording medium.

FIG. 1 is a sectional view of a tunneling magnetic sensor (tunneling magnetoresistive element) according to an embodiment which is taken in a direction parallel to a surface of the magnetic sensor opposite a recording medium.

This tunneling magnetic sensor is disposed at, for example, a trailing end of a floating slider mounted on a hard disk drive to sense a recording magnetic field from a hard disk. In the drawings, the X direction indicates a track-width direction, the Y direction indicates the direction of a leakage magnetic field from a magnetic recording medium such as a hard disk (height direction), and the Z direction indicates the movement direction of the hard disk and the stacking direction of layers of the tunneling magnetic sensor.

The lowest layer shown in FIG. 1 is a lower shield layer 21 formed of, for example, a NiFe alloy. The tunneling magnetic sensor includes a multilayer part Ti disposed on the lower shield layer 21 and a lower insulating layer 22, a hard bias layer 23, and an upper insulating layer 24 which are disposed on both sides of the multilayer part T1 in the track-width direction (X direction).

The lowest layer of the multilayer part T1 is a base layer 1 formed of a nonmagnetic material, for example, at least one element selected from the group consisting of tantalum, hafnium, niobium, zirconium, titanium, molybdenum, and tungsten. A seed layer 2 is disposed on the base layer 1. The seed layer 2 is formed of a NiFeCr alloy or chromium. If a NiFeCr alloy is used, the seed layer 2 forms a face-centered cubic (fcc) structure with an equivalent crystal plane represented as a {111} plane preferentially oriented in a direction parallel to the surfaces of the layers of the multilayer part T1. If chromium is used, the seed layer 2 forms a body-centered cubic (bcc) structure with an equivalent crystal plane represented as a {110} plane preferentially oriented in the direction parallel to the surfaces of the layers of the multilayer part T1. The base layer 1 does not necessarily have to be formed.

An antiferromagnetic layer 3 is disposed on the seed layer 2. The antiferromagnetic layer 3 is preferably formed of an antiferromagnetic material containing manganese and the element X (where X is at least one element selected from the platinum-group elements, including platinum, palladium, iridium, rhodium, ruthenium, and osmium).

The X—Mn alloy has excellent properties as an antiferromagnetic material, including high corrosion resistance, high blocking temperature, and the capability to generate a large exchange-coupling field (Hex).

The antiferromagnetic layer 3 can also be formed of an antiferromagnetic material containing manganese, the element X, and the element X' (where X' is at least one element selected from the group consisting of neon, argon, krypton, xenon, beryllium, boron, carbon, nitrogen, magnesium, aluminum, silicon, phosphorus, titanium, vanadium, chromium, iron, cobalt, nickel, copper, zinc, gallium, germanium, zirconium, niobium, molybdenum, silver, cadmium, tin, hafnium, tantalum, tungsten, rhenium, gold, lead, and rare earth elements).

A pinned magnetic layer 4 is disposed on the antiferromagnetic layer 3. In this embodiment, the pinned magnetic layer 4 corresponds to a first magnetic layer. The pinned magnetic layer 4 has a multilayer ferrimagnetic structure including, from bottom to top, a first pinned magnetic layer 4a, a nonmagnetic intermediate layer 4b, and a second pinned magnetic layer 4c. In the multilayer ferrimagnetic structure, the magnetization directions of the first pinned magnetic layer 4a and the second pinned magnetic layer 4c become antiparallel under the action of an exchange-coupling field generated at the interface between the antiferromagnetic layer 3 and the pinned magnetic layer 4 and an antiferromagnetic exchange-coupling field generated through the nonmagnetic intermediate layer 4b (RKKY interaction). This structure can stabilize the magnetization of the pinned magnetic layer 4 and apparently enhance the exchange-coupling field generated at the interface between the antiferromagnetic layer 3 and the pinned magnetic layer 4. The first pinned magnetic layer 4a and the second pinned magnetic layer 4c each have a thickness of, for example, about 12 to 24 Å. The nonmagnetic intermediate layer 4b has a thickness of, for example, about 8 to 10 Å.

The first pinned magnetic layer 4a and the second pinned magnetic layer 4c are formed of a ferromagnetic material such as a CoFe alloy, a NiFe alloy, or a CoFeNi alloy. The nonmagnetic intermediate layer 4b is formed of a nonmagnetic conductive material such as ruthenium, rhodium, iridium, chromium, rhenium, or copper.

A platinum layer 10 is disposed on the pinned magnetic layer 4. An insulating barrier layer 5 is disposed on the platinum layer 10. The platinum layer 10 will be described later in detail.

The insulating barrier layer 5 is formed of Ti—O. The insulating barrier layer 5 can be formed by sputtering using Ti—O as a target. More preferably, the insulating barrier layer 5 can be formed by forming and oxidizing a titanium film with a thickness of about 1 to 10 Å. The thickness of the titanium film is increased after the oxidation. The insulating barrier layer 5 preferably has a thickness of about 1 to 20 Å. Excessive thickness undesirably results in low output because an insufficient tunneling current flows through the insulating barrier layer 5 even if the magnetization of a free magnetic layer 8 is parallel to that of the second pinned magnetic layer 4c, the condition where the tunneling current should be maximized.

The free magnetic layer 8 is disposed on the insulating barrier layer 5. In this embodiment, the free magnetic layer 8 corresponds to a second magnetic layer. The free magnetic layer 8 includes a soft magnetic layer 7 formed of a magnetic material such as a NiFe alloy and an enhancement layer 6 disposed between the soft magnetic layer 7 and the insulating barrier layer 5 and formed of, for example, a CoFe alloy. The soft magnetic layer 7 is formed of a magnetic material with excellent soft magnetic properties. The enhancement layer 6 is formed of a magnetic material having a higher spin polarizability than the soft magnetic layer 7. If the soft magnetic layer 7 is formed of a NiFe alloy, the nickel content is preferably adjusted to 81.5 to 100 atomic percent in terms of magnetic properties.

The use of a CoFe alloy for the enhancement layer 6 can increase the rate of resistance change (ΔR/R) because the alloy has high spin polarizability. In particular, a CoFe alloy having a high iron content has a large effect of increasing the rate of resistance change (ΔR/R) of the sensor. The iron content of the CoFe alloy can be adjusted to about 50 to 95 atomic percent.

The enhancement layer 6 is thinner than the soft magnetic layer 7. If the enhancement layer 6 is excessively thick, it decreases the magnetic sensitivity of the soft magnetic layer 7. The soft magnetic layer 7 has a thickness of, for example, about 30 to 70 Å, and the enhancement layer 6 has a thickness of, for example, about 10 Å. Preferably, the enhancement layer 6 has a thickness of about 6 to 20 Å.

The free magnetic layer 8 may have a multilayer ferrimagnetic structure including magnetic layers and a nonmagnetic intermediate layer disposed therebetween. The width of the free magnetic layer 8 in the track-width direction (X direction) is defined as track width, Tw.

A protective layer 9 is disposed on the free magnetic layer 8. The protective layer 9 is formed of a nonmagnetic material such as tantalum.

Thus, the multilayer part T1 is formed on the lower shield layer 21. The multilayer part T1 has side surfaces 11 on both sides thereof in the track-width direction (X direction). These side surfaces 11 are sloped such that the width of the multilayer part T1 in the track-width direction decreases gradually from bottom to top.

In FIG. 1, the lower insulating layer 22 is disposed on the lower shield layer 21 and the side surfaces 11 of the multilayer part T1. The hard bias layer 23 is disposed on the lower insulating layer 22. The upper insulating layer 24 is disposed on the hard bias layer 23.

A bias base layer (not shown) can be disposed between the lower insulating layer 22 and the hard bias layer 23. The bias base layer is formed of, for example, chromium, tungsten, or titanium.

The insulating layers 22 and 24 are formed of an insulating material such as $Al_2O_3$ or $SiO_2$. These insulating layers 22 and 24 insulate the top and bottom of the hard bias layer 23 to prevent a current flowing through the interfaces of the layers of the multilayer part T1 perpendicularly from being shunted to the sides of the multilayer part T1 in the track-width direction. The hard bias layer 23 is formed of, for example, a CoPt alloy or a CoCrPt alloy.

An upper shield layer 26 is disposed on the multilayer part T1 and the upper insulating layer 24. The upper shield layer 26 is formed of, for example, a NiFe alloy.

In the embodiment shown in FIG. 1, the lower shield layer 21 and the upper shield layer 26 function as electrode layers for the multilayer part T1. A current flows through the surfaces of the layers of the multilayer part T1 perpendicularly (in a direction parallel to the Z direction).

The free magnetic layer 8 is magnetized in a direction parallel to the track-width direction (X direction) by the action of a bias magnetic field from the hard bias layer 23. On the other hand, the first pinned magnetic layer 4a and second pinned magnetic layer 4c of the pinned magnetic layer 4 are magnetized in a direction parallel to the height direction (Y direction). In the multilayer ferrimagnetic structure of the pinned magnetic layer 4, the magnetization of the first pinned magnetic layer 4a is antiparallel to that of the second pinned magnetic layer 4c. While the magnetization of the pinned magnetic layer 4 is fixed (not changed by an external magnetic field), the magnetization of the free magnetic layer 8 is changed by an external magnetic field.

If the magnetization of the free magnetic layer 8 becomes antiparallel to that of the second pinned magnetic layer 4c under the action of an external magnetic field, a tunneling current flowing through the insulating barrier layer 5 is minimized, meaning that the resistance is maximized. If the magnetization of the free magnetic layer 8 becomes parallel to that of the second pinned magnetic layer 4c, the tunneling current is maximized, meaning that the resistance is minimized.

Based on this principle, a change in electrical resistance is detected as a voltage change when an external magnetic field changes the magnetization of the free magnetic layer 8. The tunneling magnetic sensor thus senses a leakage magnetic field from a recording medium.

Features of the tunneling magnetic sensor according to this embodiment will be described.

In this embodiment, as shown in FIG. 1, the platinum layer 10 is disposed between the pinned magnetic layer 4 and the insulating barrier layer 5. This platinum layer 10 can probably vary the barrier height (potential height) and barrier width (potential width) of the insulating barrier layer 5 to reduce the absolute value of VCR.

VCR, a measure of the dependence of sensor resistance on voltage change, is calculated by the following formula: VCR (ppm/mV)=[(R2−R1)/(V2−V1)]/R1 (where R1 is sensor resistance at voltage V1, R2 is sensor resistance at voltage V2, and voltage V2 is higher than voltage V1). The term (R2−R1)/(V2−V1) in this formula indicates the gradient (Ω/mV) of sensor resistance to voltage change. VCR is calculated by dividing the gradient by sensor resistance R1 at voltage V1, namely, the minimum voltage.

Smaller absolute values of VCR indicate less dependence of sensor resistance on voltage change, that is, smaller variations in sensor resistance with voltage change. A smaller absolute value of VCR is required to increase operating stability. Because the platinum layer 10 is disposed between the pinned magnetic layer 4 and the insulating barrier layer 5, the tunneling magnetic sensor according to this embodiment, which includes the Ti—O insulating barrier layer 5, can achieve a smaller absolute value of VCR than known tunneling magnetic sensors.

In addition, the Ti—O insulating barrier layer 5 can be formed on the platinum layer 10 to increase flatness at its bottom interface (where the insulating barrier layer 5 starts to be formed), thus achieving a more uniform thickness. This reduces a leakage current flowing through thin portions resulting from unevenness in the thickness of the insulating barrier layer 5. Such a leakage current does not contribute to resistance change. The tunneling magnetic sensor according to this embodiment can therefore provide a higher rate of resistance change (ΔR/R) at low RA than known tunneling magnetic sensors.

The platinum layer 10 preferably has a thickness of more than about 0 Å to 4 Å. Excessive thickness undesirably results in a decreased rate of resistance change (ΔR/R). According to the experiments described later, if the platinum layer 10 has a thickness of about 0.4 to 2 Å, preferably about 1 to 2 Å, the tunneling magnetic sensor can effectively provide a higher rate of resistance change (ΔR/R) at low RA than known tunneling magnetic sensors.

The insulating barrier layer 5 is formed of Ti—O in this embodiment, although it can also be formed of Ti—Mg—O. The use of Ti—Mg—O for the insulating barrier layer 5 is effective to provide a larger effect of reducing the absolute value of VCR. According to the experiments described later, a Ti—Mg—O insulating barrier layer can provide a high rate of resistance change (ΔR/R) at low RA comparable to that of a Ti—O insulating barrier layer. The insulating barrier layer 5 preferably contains magnesium in an amount of more than about 0 atomic percent to about 20 atomic percent based on 100 atomic percent of the total content of titanium and magnesium.

As described later, the tunneling magnetic sensor is subjected to annealing (heat treatment) during a production process thereof. The annealing is performed at about 240° C. to 310° C. For example, this annealing treatment is performed in a magnetic field to induce an exchange-coupling field (Hex) between the antiferromagnetic layer 3 and the first pinned magnetic layer 4a of the pinned magnetic layer 4.

Figure 2:
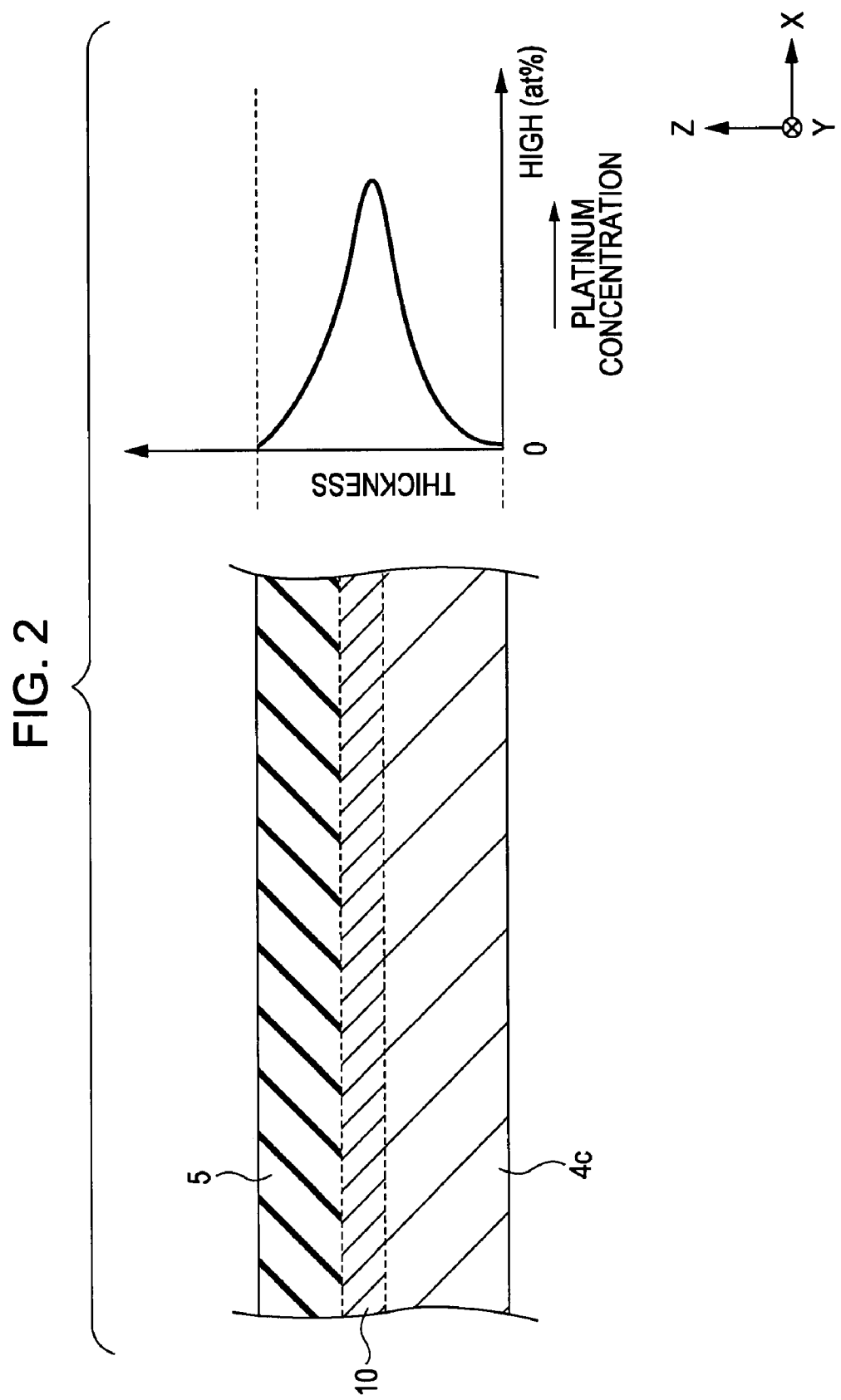
FIG. 2 is a set of a partial enlarged sectional view of a structure including a second pinned magnetic layer, a platinum layer, and an insulating barrier layer in this embodiment and a graph showing variations in platinum concentration.

Referring to FIG. 2, the annealing causes interdiffusion of constituent elements at the interfaces between the platinum layer 10 and the second pinned magnetic layer 4c and between the platinum layer 10 and the insulating barrier layer 5. As a result, the interfaces disappear, and such a concentration gradient is formed that the platinum concentration decreases gradually from inside the platinum layer 10, for example, from the center thereof, to inside the second pinned magnetic layer 4c and the insulating barrier layer 5.

This concentration gradient can probably have some effect on, for example, the crystal structures of the insulating barrier layer 5, the pinned magnetic layer 4, and the free magnetic layer 8 to improve the characteristics of the tunneling magnetic sensor, including VCR, RA, and the rate of resistance change (ΔR/R).

Figure 3:
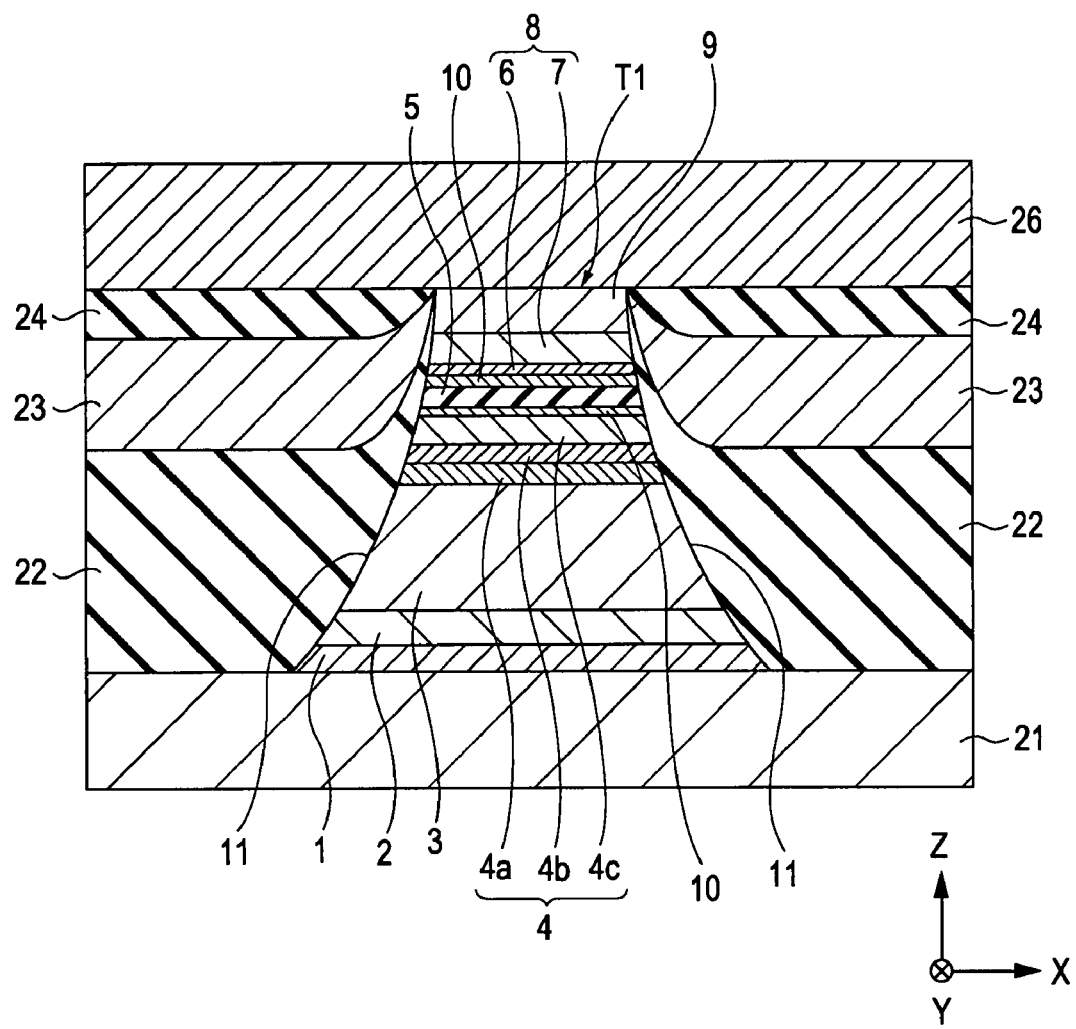
FIG. 3 is a sectional view of a tunneling magnetic sensor according to an embodiment different from the embodiment shown in FIG. 1 which is taken in a direction parallel to a surface of the magnetic sensor opposite a recording medium.

The position where the platinum layer 10 is formed will be described. In the embodiment shown in FIG. 1, the platinum layer 10 is disposed between the pinned magnetic layer 4 and the insulating barrier layer 5. Referring to FIG. 3, another platinum layer 10 can be formed between the insulating barrier layer 5 and the free magnetic layer 8. Also, referring to FIG. 4, another platinum layer 10 can be formed between the soft magnetic layer 7 and enhancement layer 6 of the free magnetic layer 8.

That is, the platinum layer 10 is disposed in at least one of the positions between the pinned magnetic layer 4 and the insulating barrier layer 5, between the insulating barrier layer 5 and the free magnetic layer 8, and between the soft magnetic layer 7 and enhancement layer 6 of the free magnetic layer 8 in this embodiment. Preferably, the platinum layer 10 is disposed at least between the insulating barrier layer 5 and the underlying layer, namely, the pinned magnetic layer 4. According to the experiments described later, such a tunneling magnetic sensor not only can provide the effect of reducing the absolute value of VCR, but also can provide a higher rate of resistance change ($\Delta R/R$) at low RA than known tunneling magnetic sensors.

In this embodiment, the antiferromagnetic layer 3, the pinned magnetic layer (first magnetic layer) 4, the insulating barrier layer 5, and the free magnetic layer (second magnetic layer) 8 are formed in the above order, although they may also be formed in the reverse order. In this case, the platinum layer 10 is preferably disposed at least between the free magnetic layer 8, corresponding to the first magnetic layer in this embodiment, and the insulating barrier layer 5 to reduce the absolute value of VCR and ensure a high rate of resistance change ($\Delta R/R$) at low RA.

A process for producing the tunneling magnetic sensor according to this embodiment will be described. FIGS. 5 to 8 are partial sectional views, taken in the same direction as FIG. 1, of the tunneling magnetic sensor during the production process.

Figure 5:
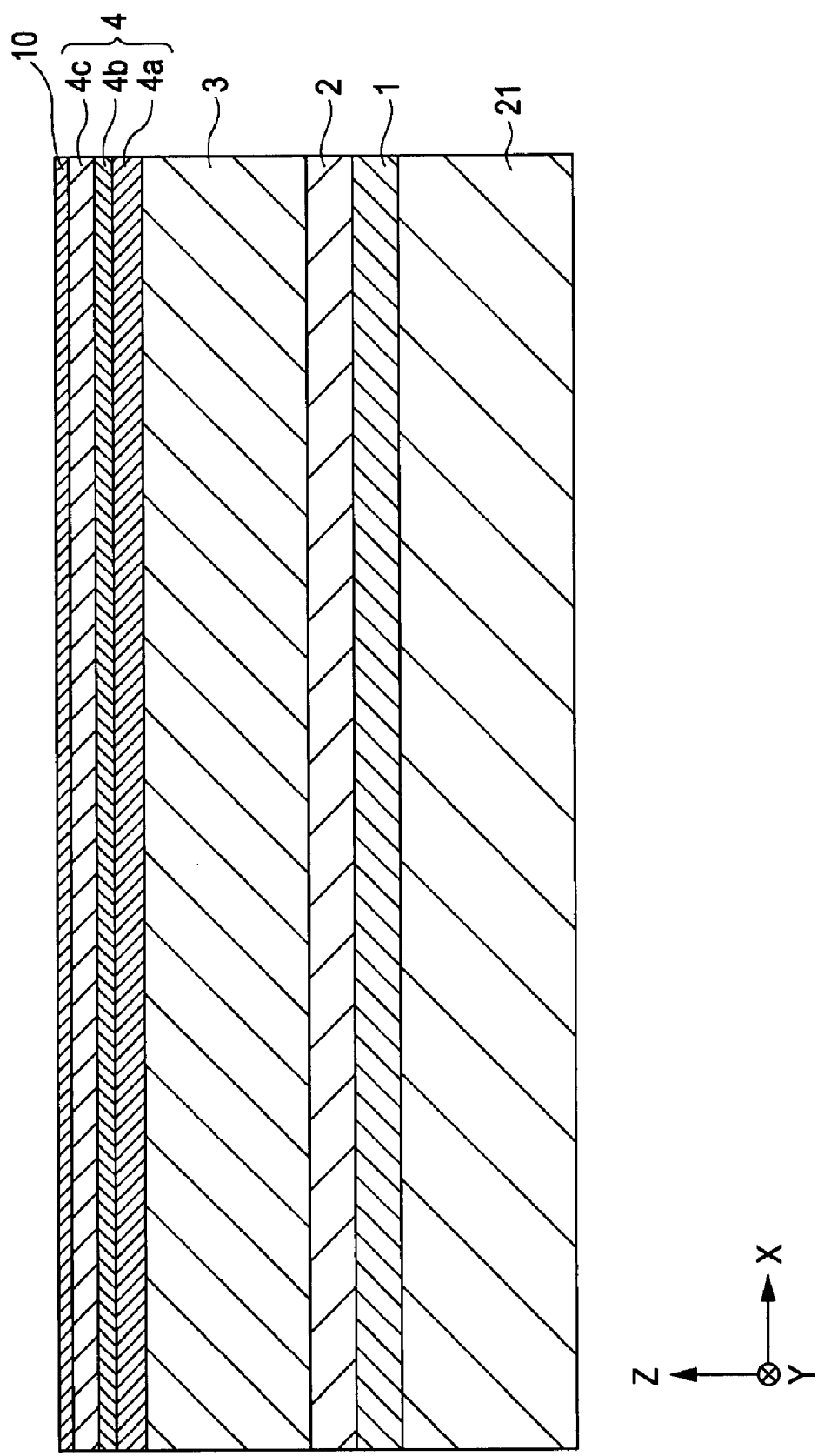
FIG. 5 is a diagram illustrating a step of a process for producing the tunneling magnetic sensor according to the embodiment shown in FIG. 1 (a sectional view of the tunneling magnetic sensor during the production process which is taken in the direction parallel to the surface of the magnetic sensor opposite a recording medium)

In the step shown in FIG. 5, the base layer 1, the seed layer 2, the antiferromagnetic layer 3, the first pinned magnetic layer 4a, the nonmagnetic intermediate layer 4b, and the second pinned magnetic layer 4c are continuously formed on the lower shield layer 21 by, for example, sputtering.

A surface of the second pinned magnetic layer 4c is subjected to plasma treatment.

After the plasma treatment, the platinum layer 10 is formed on the second pinned magnetic layer 4c by, for example, sputtering. The platinum layer 10 is formed to an extremely small thickness, namely, more than about 0 Å to 4 Å, preferably about 0.4 to 2 Å. If the surface of the platinum layer 10 is subjected to the plasma treatment, it would remove most of the platinum layer 10. This impairs the effect of the platinum layer 10, that is, the effect of reducing the absolute value of VCR and providing a high rate of resistance change ($\Delta R/R$). The plasma treatment is a step necessary to improve the flatness of the surface of the second pinned magnetic layer 4c. In combination with the plasma treatment, the formation of the extremely thin platinum layer 10 on the surface of the second pinned magnetic layer 4c more effectively improves the flatness of the bottom interface of the insulating barrier layer 5 to be formed in the subsequent step.

Figure 6:
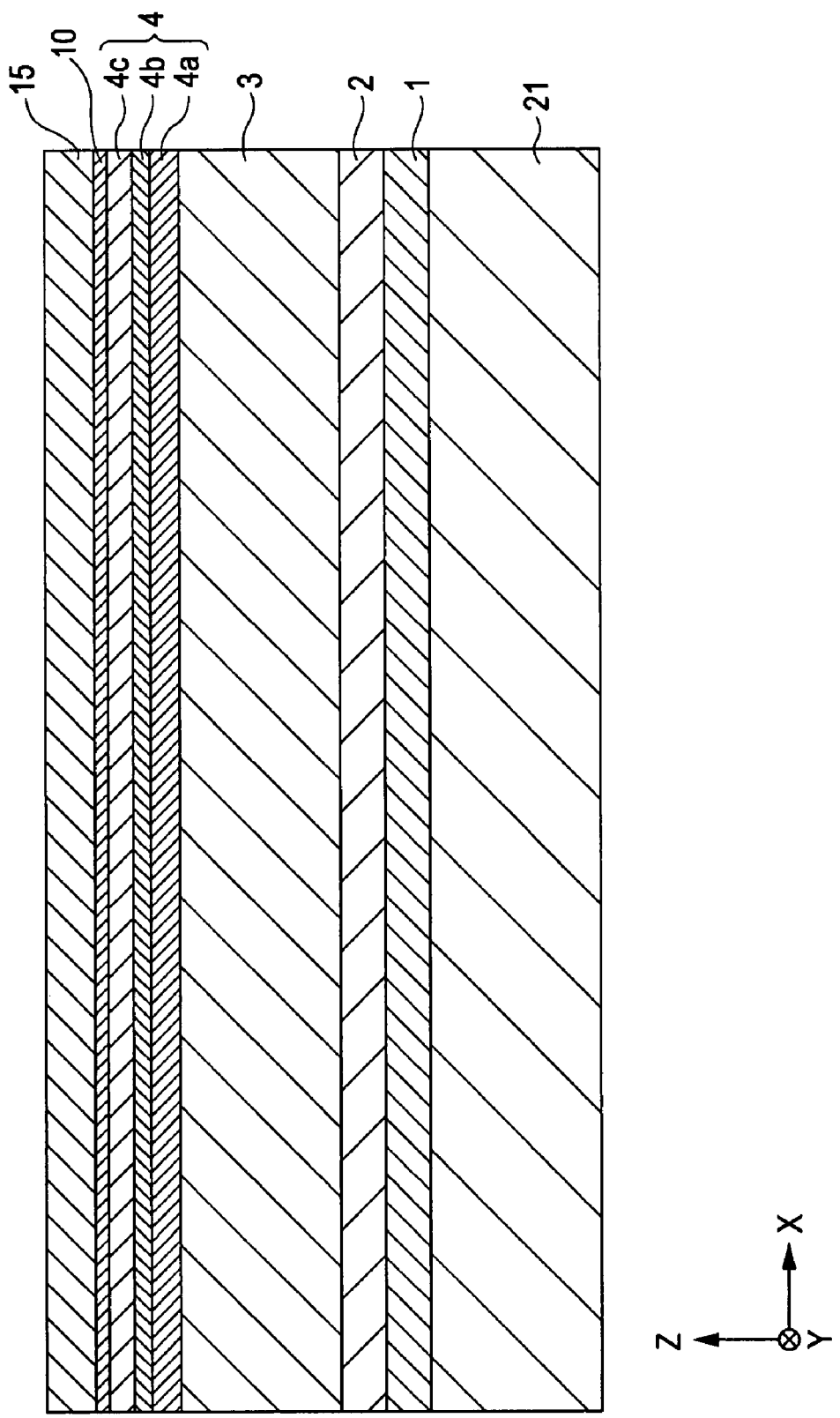
FIG. 6 is a diagram illustrating a step following the step of FIG. 5 (a sectional view of the tunneling magnetic sensor during the production process which is taken in the direction parallel to the surface of the magnetic sensor opposite a recording medium)

In the step shown in FIG. 6, a titanium layer 15 is formed on the platinum layer 10 by sputtering. The titanium layer 15 is formed to such a thickness as to reach the thickness of the insulating barrier layer 5 after oxidation in the subsequent step.

The titanium layer 15 is oxidized by radical oxidation, ion oxidation, plasma oxidation, or spontaneous oxidation to form the insulating barrier layer 5.

The free magnetic layer 8, which includes the enhancement layer 6 and the soft magnetic layer 7, is formed on the insulating barrier layer 5 by sputtering, and the protective layer 9 is formed on the free magnetic layer 8 by sputtering with, for example, tantalum. Thus, the multilayer part T1 including the layers from the base layer 1 to the protective layer 9 is formed.

Figure 7:
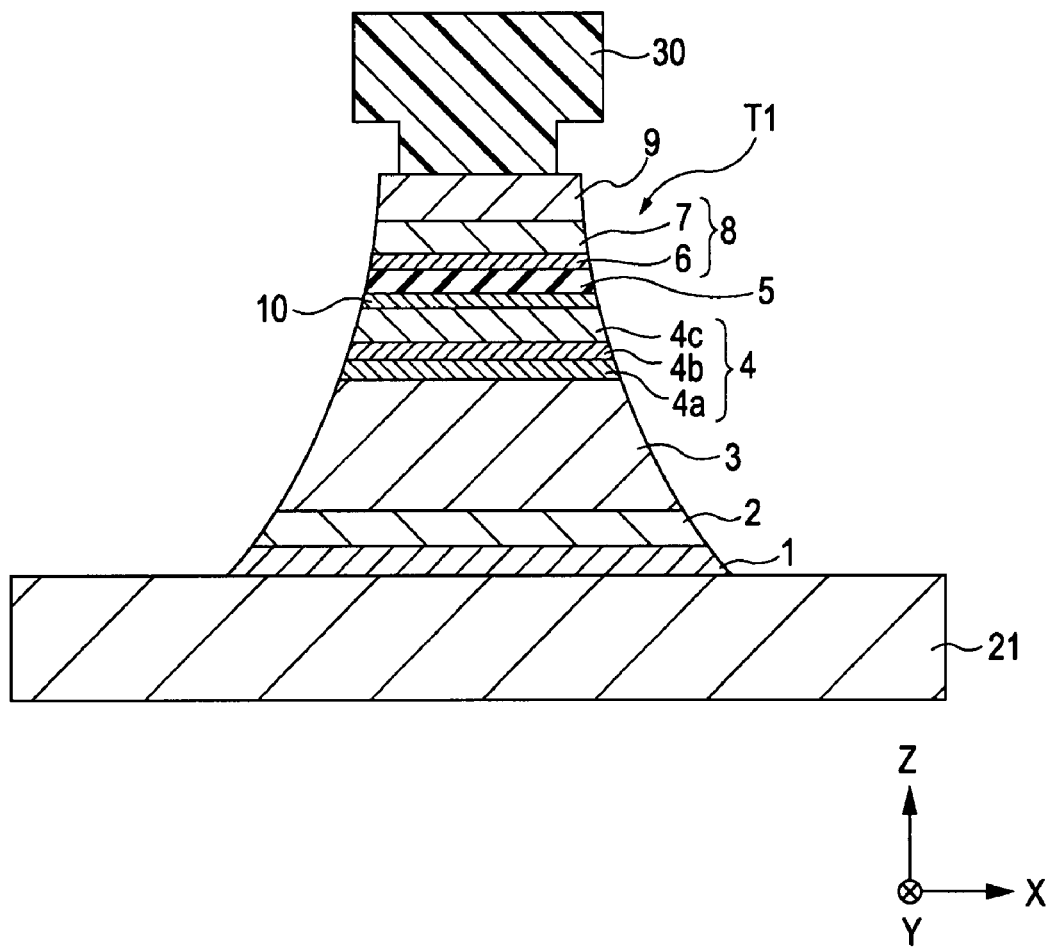
FIG. 7 is a diagram illustrating a step following the step of FIG. 6 (a sectional view of the tunneling magnetic sensor during the production process which is taken in the direction parallel to the surface of the magnetic sensor opposite a recording medium)

Referring to FIG. 7, a lift-off resist layer 30 is formed on the multilayer part T1. Side portions of the multilayer part T1 which are not covered with the lift-off resist layer 30 in the track-width direction (X direction) are removed by, for example, etching.

Figure 8:
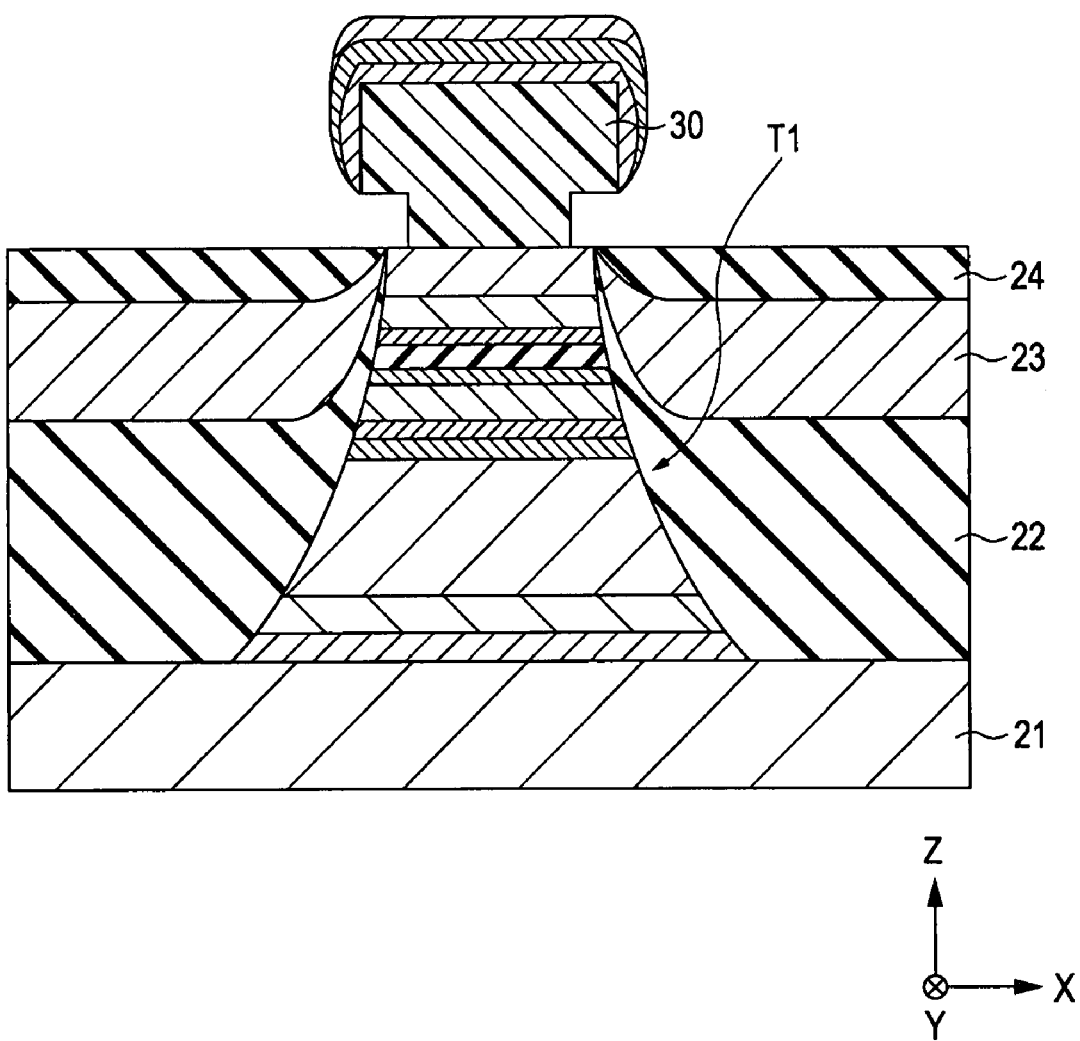
FIG. 8 is a diagram illustrating a step following the step of FIG. 7 (a sectional view of the tunneling magnetic sensor during the production process which is taken in the direction parallel to the surface of the magnetic sensor opposite a recording medium)

Referring to FIG. 8, the lower insulating layer 22, the hard bias layer 23, and the upper insulating layer 24 are sequentially formed on the lower shield layer 21 on both sides of the multilayer part T1 in the track-width direction.

The lift-off resist layer 30 is removed before the upper shield layer 26 is formed on the multilayer part T1 and the upper insulating layer 24.

The above process for producing the tunneling magnetic sensor involves annealing, typically, an annealing step for inducing an exchange-coupling field (Hex) between the antiferromagnetic layer 3 and the first pinned magnetic layer 4a.

Figure 4:
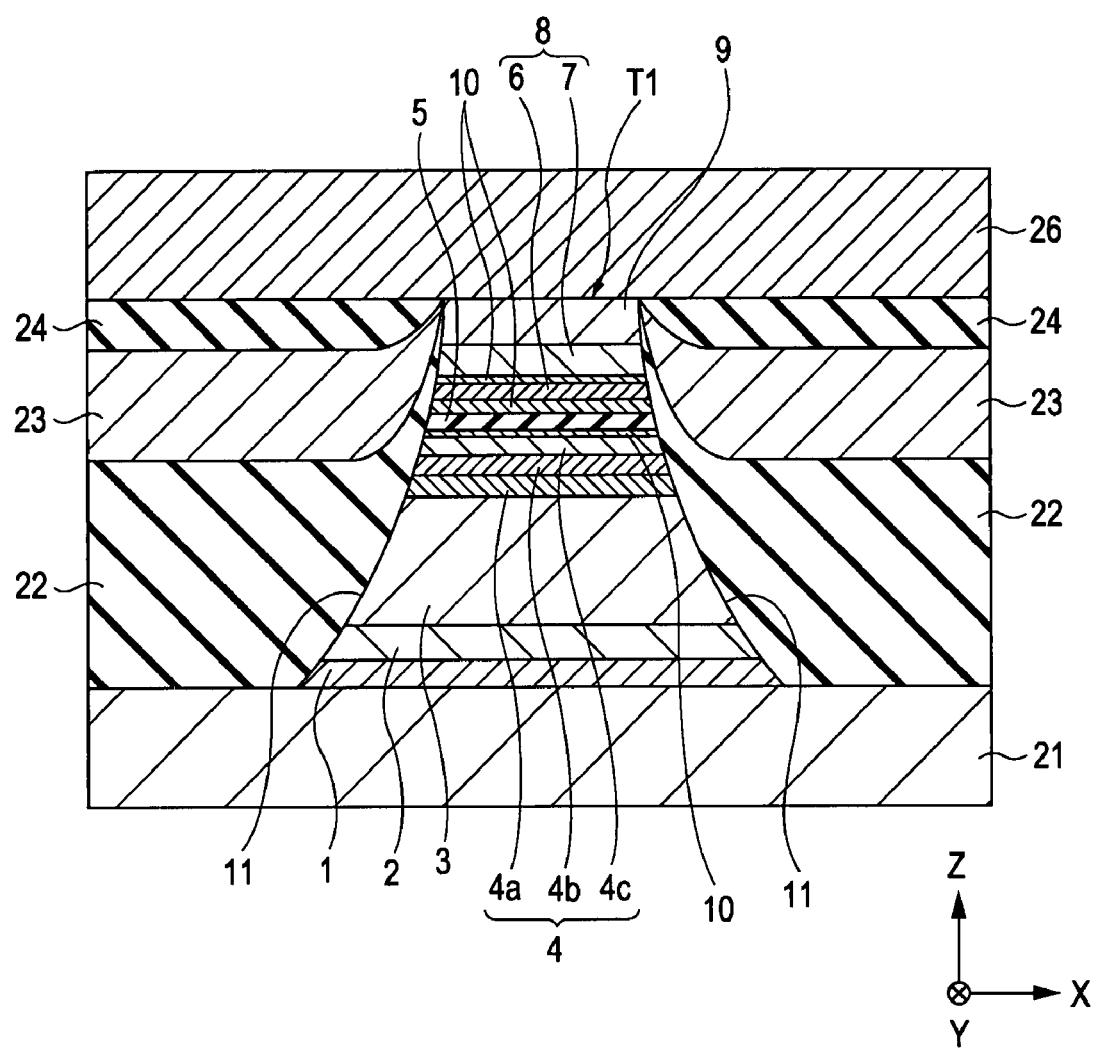
FIG. 4 is a sectional view of a tunneling magnetic sensor according to an embodiment different from the embodiment shown in FIG. 1 which is taken in a direction parallel to a surface of the magnetic sensor opposite a recording medium.

The platinum layer 10, which is formed between the second pinned magnetic layer 4c and the insulating barrier layer 5 in the above process for producing the tunneling magnetic sensor, may also be formed between the insulating barrier layer 5 and the enhancement layer 6, as shown in FIG. 3, and between the enhancement layer 6 and the soft magnetic layer 7, as shown in FIG. 4. In this embodiment, the platinum layer 10 is disposed in at least one of the positions between the second pinned magnetic layer 4c and the insulating barrier layer 5, between the insulating barrier layer 5 and the enhancement layer 6, and between the enhancement layer 6 and the soft magnetic layer 7. Preferably, the platinum layer 10 is formed at least between the second pinned magnetic layer 4c and the insulating barrier layer 5 to reduce the absolute value of VCR and provide a high rate of resistance change ($\Delta R/R$) at low RA.

The platinum layer 10 is formed to an extremely small thickness, namely, more than about 0 Å to 4 Å. If the platinum layer 10 is excessively thick, it causes a significant decrease in the rate of resistance change ($\Delta R/R$). This attenuates the effect of the platinum layer 10 because such a tunneling magnetic sensor tends to exhibit a lower rate of resistance change ($\Delta R/R$) than known tunneling magnetic sensors including no platinum layer. The platinum layer 10 is thus extremely thin (preferably, about 0.4 to 2 Å), so that it will be formed discontinuously (in an island pattern) on the second pinned magnetic layer 4c. The surface of the second pinned magnetic layer 4c, which has been planarized to some extent by the plasma treatment, can be more effectively planarized because, for example, platinum atoms enter gaps left in the surface of the second pinned magnetic layer 4c. Thus, the tunneling magnetic sensor can provide a high rate of resistance change ($\Delta R/R$) at low RA.

The platinum layer 10 can reduce the absolute value of VCR because it probably varies the barrier height (potential height) and barrier width (potential width) of the insulating barrier layer 5. Accordingly, the platinum layer 10 can probably vary the barrier height (potential height) and barrier width (potential width) of the insulating barrier layer 5 through element diffusion by heat treatment to provide a lower absolute value of VCR than known tunneling magnetic sensors even if the platinum layer 10 is not disposed in contact with the top or bottom of the insulating barrier layer 5 but is disposed between the enhancement layer 6 and the soft magnetic layer 7, as in one of the examples of this embodiment. Nevertheless, the platinum layer 10 is preferably formed on the top or bottom of the insulating barrier layer 5 to further reduce the absolute value of VCR. According to the experiments described later, the platinum layer 10 can provide a larger effect of reducing the absolute value of VCR if in contact with the insulating barrier layer 5.

The insulating barrier layer 5 is formed of Ti—O in this embodiment, although it can also be formed of Ti—Mg—O. The use of Ti—Mg—O for the insulating barrier layer 5 is preferred to further reduce the absolute value of VCR. As in the case of a Ti—O insulating barrier layer, a Ti—Mg—O insulating barrier layer can provide a high rate of resistance change ($\Delta R/R$) at low RA. The insulating barrier layer 5 preferably contains magnesium in an amount of more than about 0 atomic percent to about 20 atomic percent based on 100 atomic percent of the total content of titanium and magnesium.

The Ti—Mg—O insulating barrier layer 5 can be formed by, for example, forming a multilayer structure of titanium and magnesium layers to such thicknesses that the magnesium content is more than about 0 atomic percent to about 20 atomic percent based on 100 atomic percent of the total content of titanium and magnesium and then oxidizing the titanium and magnesium layers. Alternatively, the Ti—Mg—O insulating barrier layer 5 can be formed by forming a TiMg alloy layer containing magnesium in an amount of more than about 0 atomic percent to about 20 atomic percent based on 100 atomic percent of the total content of titanium and magnesium and then oxidizing the TiMg alloy layer.

EXAMPLES

Experiment for VCR

Tunneling magnetic sensors shown in FIG. 1 were produced. First, a total of six samples were prepared, including Comparative Example 1, Examples 1 to 4, and Reference Example 1.

The basic film structure of the samples included, from bottom to top, the base layer 1, the seed layer 2, the antiferromagnetic layer 3, the pinned magnetic layer 4, the insulating barrier layer 5, the free magnetic layer 8, and a protective layer. The base layer 1 was formed of tantalum and had an average thickness of about 30 Å. The seed layer 2 was formed of NiFeCr and had an average thickness of about 50 Å. The antiferromagnetic layer 3 was formed of IrMn and had an average thickness of about 70 Å. The first pinned magnetic layer 4a was formed of $Co_{70at\%}Fe_{30at\%}$ and had an average thickness of about 14 Å. The nonmagnetic intermediate layer 4b was formed of ruthenium and had an average thickness of about 9.1 Å. The second pinned magnetic layer 4c was formed of $Co_{90at\%}Fe_{10at\%}$ and had an average thickness of about 18 Å. The enhancement layer 6 was formed of $Co_{10at\%}Fe_{90at\%}$ and had an average thickness of about 10 Å. The soft magnetic layer 7 was formed of $Ni_{86at\%}Fe_{14at\%}$ and had an average thickness of about 50 Å. The protective layer included a ruthenium layer having an average thickness of about 10 Å and a tantalum layer having an average thickness of about 280 Å.

In Comparative Example 1 and Examples 1 to 4, the insulating barrier layer 5 was formed of Ti—O. The Ti—O insulating barrier layer 5 was formed by forming a titanium layer to a thickness of about 4 to 6 Å and subjecting the titanium layer to radical oxidation.

In each example, a surface of the second pinned magnetic layer 4c was subjected to plasma treatment.

The above basic film structure was subjected to heat treatment at about 240° C. to 300° C. for about four hours.

In addition, the platinum layer 10 was formed at predetermined positions of the samples of Examples 1 to 4, as shown in Table 1 below.

TABLE 1

| Film structure | Platinum layer | Insulating barrier layer | Platinum layer | Enhancement layer | Platinum layer | VCR (ppm/mV) |
|---|---|---|---|---|---|---|
| Comparative Example 1 | Not formed | Ti—O | Not formed | CoFe | Not formed | −2917 |
| Example 1 | Formed (2 Å) | Ti—O | Not formed | CoFe | Not formed | −2754 |
| Example 2 | Formed (4 Å) | Ti—O | Not formed | CoFe | Not formed | −2611 |
| Example 3 | Formed (2 Å) | Ti—O | Formed (2 Å) | CoFe | Not formed | −2354 |
| Example 4 | Formed (2 Å) | Ti—O | Not formed | CoFe | Formed (4 Å) | −2717 |
| Reference Example 1 | Not formed | Al—O | Not formed | CoFe | Not formed | −130 |

Film structure (left: second pinned magnetic layer side; right: soft magnetic layer side)

As shown in the "film structure" column of Table 1, the sample of Example 1 included a platinum layer 10 with a thickness of about 2 Å between the second pinned magnetic layer 4c and the insulating barrier layer (Ti—O) 5. The sample of Example 2 included a platinum layer 10 with a thickness of about 4 Å between the second pinned magnetic layer 4c and the insulating barrier layer (Ti—O) 5. The sample of Example 3 included a platinum layer 10 with a thickness of about 2 Å between the second pinned magnetic layer 4c and the insulating barrier layer (Ti—O) 5 and another platinum layer 10 with a thickness of about 2 Å between the insulating barrier layer 5 and the enhancement layer 6. The sample of Example 4 included a platinum layer 10 with a thickness of about 2 Å between the second pinned magnetic layer 4c and the insulating barrier layer (Ti—O) 5 and another platinum layer 10 with a thickness of about 4 Å between the enhancement layer 6 and the soft magnetic layer 7.

In Reference Example 1, the insulating barrier layer 5 was formed of aluminum oxide (Al—O). The Al—O insulating barrier layer 5 was formed by forming an aluminum layer to a thickness of about 5 Å and oxidizing the aluminum layer.

Unlike Examples 1 to 4, no platinum layer 10 was formed in Comparative Example 1 and Reference Example 1.

Figure 9:
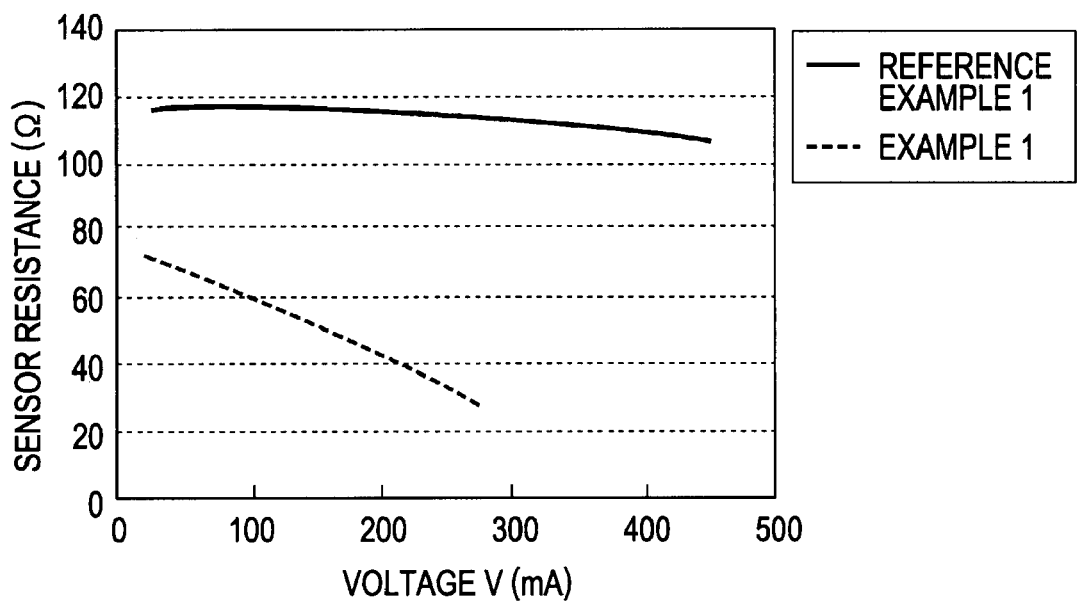
FIG. 9 is a graph showing the relationship between voltage and sensor resistance for Example 1 (Ti—O insulating barrier layer) and Reference Example 1 (Al—O insulating barrier layer)

In this experiment, variations in sensor resistance with voltage were determined by applying voltages of up to several hundreds of millivolts to the samples. FIG. 9 is a graph showing the relationship between the sensor resistance of the samples of Reference Example 1 and Example 1 and the voltage applied thereto. The experiment results were used to calculate VCR (ppm/mV) by the formula $[(R2-R1)/(V2-V1)]/R1$ (where V2>V1). The same values of voltages V1 and V2 applied were used in all of Comparative Example 1, Examples 1 to 4, and Reference Example 1.

Figure 10:
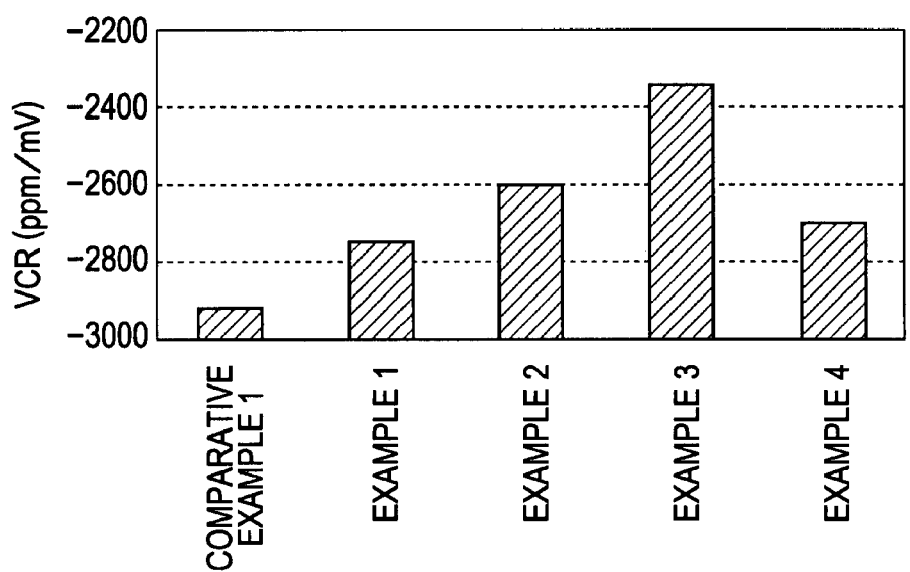
FIG. 10 is a bar chart showing the VCR of samples of Examples 1 to 4 and Comparative Example 1.

According to Table 1 and FIG. 10, the samples of Examples 1 to 4, which included at least one platinum layer 10, had lower absolute values of VCR than the sample of Comparative Example 1. This means that the VCR was improved. Unlike the samples prepared using Ti—O for the insulating barrier layer 5, the VCR of the sample of Reference Example 1, which was prepared using Al—O for the insulating barrier layer 5, did not need to be improved because the original absolute value of VCR was significantly low.

According to Table 1 and FIG. 10, the sample of Example 3, which included the two platinum layers 10 on the top and bottom of the insulating barrier layer 5, had the lowest absolute value of VCR among the samples of Examples 1 to 4. This means that the VCR was more effectively improved.

A comparison of the samples of Example 1 and Example 4 revealed that the sample of Example 4 had a lower absolute value of VCR than the sample of the Example 1. The sample of Example 4 had the same film structure as the sample of Example 1 but included the additional platinum layer 10 between the enhancement layer 6 and the soft magnetic layer 7. These results show that the effect of reducing the absolute value of VCR can also be provided by forming the platinum layer 10 between the enhancement layer 6 and the soft magnetic layer 7.

Next, tunneling magnetic sensors of Reference Examples 2 to 12 and Comparative Example 2, as shown in Table 2, were produced.

multilayer structures of titanium and magnesium layers as metal layers before oxidation and subjecting the titanium and magnesium layers to radical oxidation. In Comparative Example 2, the insulating barrier layer 5 was formed of Ti—O. The Ti—O insulating barrier layer S was formed by oxidizing a single titanium layer.

In each example, a surface of the second pinned magnetic layer 4c was subjected to plasma treatment.

The above basic film structure was subjected to heat treatment at about 240° C. to 300° C. for about four hours.

Figure 11:
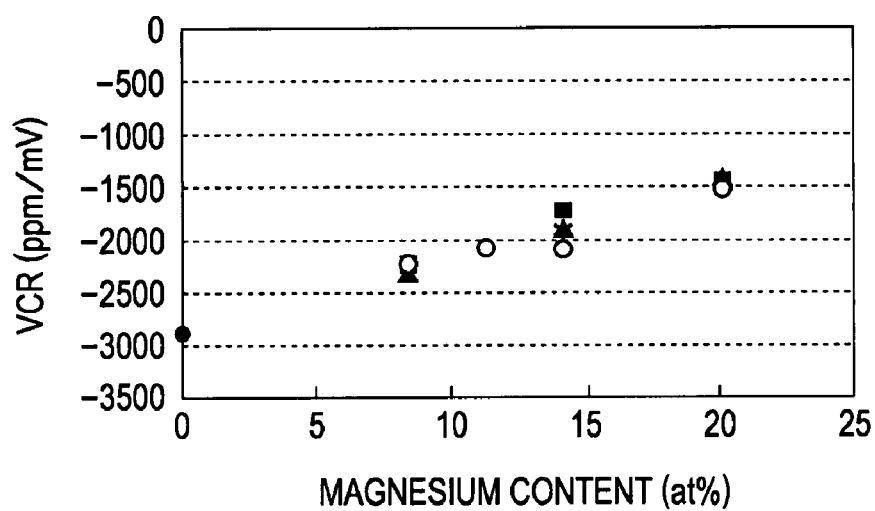
FIG. 11 is a graph showing the relationship between VCR and the magnesium content of Ti—Mg—O insulating barrier layers.

According to Table 2 and FIG. 11, the samples of Reference Examples 2 to 12 had lower absolute values of VCR than the sample of Comparative Example 2. These results show that the absolute value of VCR can be more effectively reduced by forming a Ti—Mg—O insulating barrier layer instead of a Ti—O insulating barrier layer and forming the platinum layer 10 at a predetermined position, as shown in Table 1.

According to Table 2 and FIG. 11, additionally, the magnesium content is preferably adjusted to the range of more than about 0 atomic percent to about 20 atomic percent based on 100 atomic percent of the total content of titanium and magnesium. In particular, the effect of reducing the absolute value of VCR can be more effectively facilitated if the mag-

TABLE 2

| No. | Metal layer structure of insulating barrier layer (left: second pinned magnetic layer side) | | | | | | VCR (ppm/mV) |
|---|---|---|---|---|---|---|---|
| | Ti (Å) | Mg (Å) | Ti (Å) | Mg (Å) | Total (Å) | Mg (at %) | |
| Reference Example 2 | | | 5.0 | 0.6 | 5.6 | 8.3 | −2304 |
| Reference Example 3 | | | 4.6 | 1.0 | 5.6 | 14.1 | −1863 |
| Reference Example 4 | | | 4.2 | 1.4 | 5.6 | 20.1 | −1392 |
| Reference Example 5 | | 0.6 | 5.0 | | 5.6 | 8.3 | −2210 |
| Reference Example 6 | | 1.0 | 4.6 | | 5.6 | 14.1 | −1715 |
| Reference Example 7 | | 1.4 | 4.2 | | 5.6 | 20.1 | −1437 |
| Reference Example 8 | | 0.3 | 5.0 | 0.3 | 5.6 | 8.3 | −2227 |
| Reference Example 9 | | 0.4 | 4.8 | 0.4 | 5.6 | 11.2 | −2066 |
| Reference Example 10 | | 0.5 | 4.6 | 0.5 | 5.6 | 14.1 | −2085 |
| Reference Example 11 | | 0.7 | 4.2 | 0.7 | 5.6 | 20.1 | −1508 |
| Reference Example 12 | 2.3 | 1.0 | 2.3 | | 5.6 | 14.1 | −1883 |
| Comparative Example 2 | | | 5.6 | | 5.6 | 0.0 | −2871 |

The basic film structure of the samples included, from bottom to top, the base layer 1, the seed layer 2, the antiferromagnetic layer 3, the pinned magnetic layer 4, the insulating barrier layer 5, the free magnetic layer 8, and a protective layer. The base layer 1 was formed of tantalum and had an average thickness of about 30 Å. The seed layer 2 was formed of NiFeCr and had an average thickness of about 50 Å. The antiferromagnetic layer 3 was formed of IrMn and had an average thickness of about 70 Å. The first pinned magnetic layer 4a was formed of $Co_{70at\%}Fe_{30at\%}$ and had an average thickness of about 14 Å. The nonmagnetic intermediate layer 4b was formed of ruthenium and had an average thickness of about 9.1 Å. The second pinned magnetic layer 4c was formed of $Co_{90at\%}Fe_{10at\%}$ and had an average thickness of about 18 Å. The enhancement layer 6 was formed of $Co_{10at\%}Fe_{90at\%}$ and had an average thickness of about 10 Å. The soft magnetic layer 7 was formed of $Ni_{86at\%}Fe_{14at\%}$ and had an average thickness of about 50 Å. The protective layer included a ruthenium layer having an average thickness of about 10 Å and a tantalum layer having an average thickness of about 280 Å.

In Reference Examples 2 to 12, as shown in Table 2, the insulating barrier layer 5 was formed of Ti—Mg—O. The Ti—Mg—O insulating barrier layer 5 was formed by forming nesium content is adjusted to about 5 atomic percent or more, more preferably about 10 atomic percent or more.

Experiment for RA and Rate of Resistance Change (ΔR/R)

Tunneling magnetic sensors shown in FIG. 1 were produced as samples. The basic film structure of the samples included, from bottom to top, the base layer 1, the seed layer 2, the antiferromagnetic layer 3, the pinned magnetic layer 4, the platinum layer 10, the insulating barrier layer 5, the free magnetic layer 8, and a protective layer. The base layer 1 was formed of tantalum and had an average thickness of about 30 Å. The seed layer 2 was formed of NiFeCr and had an average thickness of about 50 Å. The antiferromagnetic layer 3 was formed of IrMn and had an average thickness of about 70 Å. The first pinned magnetic layer 4a was formed of $Co_{70at\%}Fe_{30at\%}$ and had an average thickness of about 14 Å. The nonmagnetic intermediate layer 4b was formed of ruthenium and had an average thickness of about 9.1 Å. The second pinned magnetic layer 4c was formed of $Co_{90at\%}Fe_{10at\%}$ and had an average thickness of about 18 Å. The insulating barrier layer 5 was formed of Ti—O. The enhancement layer 6 was formed of $Co_{10at\%}Fe_{90at\%}$ and had an average thickness of about 10 Å. The soft magnetic layer 7 was formed of $Ni_{86at\%}Fe_{14at\%}$ and had an average thickness of about 50 Å. The protective layer included a ruthenium layer having an average thickness of about 10 Å and a tantalum layer having an average thickness of about 280 Å.

In each example, the Ti—O insulating barrier layer 5 was formed by forming a titanium layer to a thickness of about 4 to 6 Å and subjecting the titanium layer to radical oxidation.

In each example, a surface of the second pinned magnetic layer 4c was subjected to plasma treatment.

The above basic film structure was subjected to heat treatment at about 240° C. to 300° C. for about four hours.

The samples prepared in this experiment included a sample including no platinum layer 10 (comparative example) and samples including platinum layers 10 with thicknesses of about 1, 2, and 4 Å between the second pinned magnetic layer 4c and the insulating barrier layer 5 (examples of the present invention). These samples were examined for RA and the rate of resistance change ($\Delta R/R$).

Figure 12:
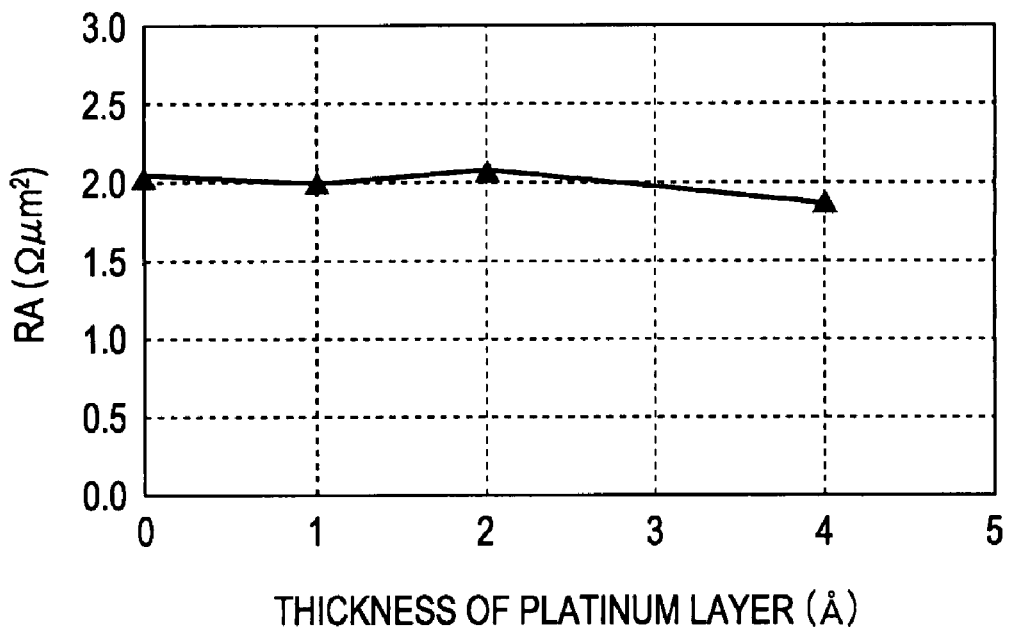
FIG. 12 is a graph showing the relationship between RA and the thickness of platinum layers formed between insulating barrier layers and pinned magnetic layers.

According to FIG. 12, the samples of the examples of the present invention, which included the platinum layer 10, had low RA comparable to that of the sample of the comparative example, which included no platinum layer 10.

Figure 13:
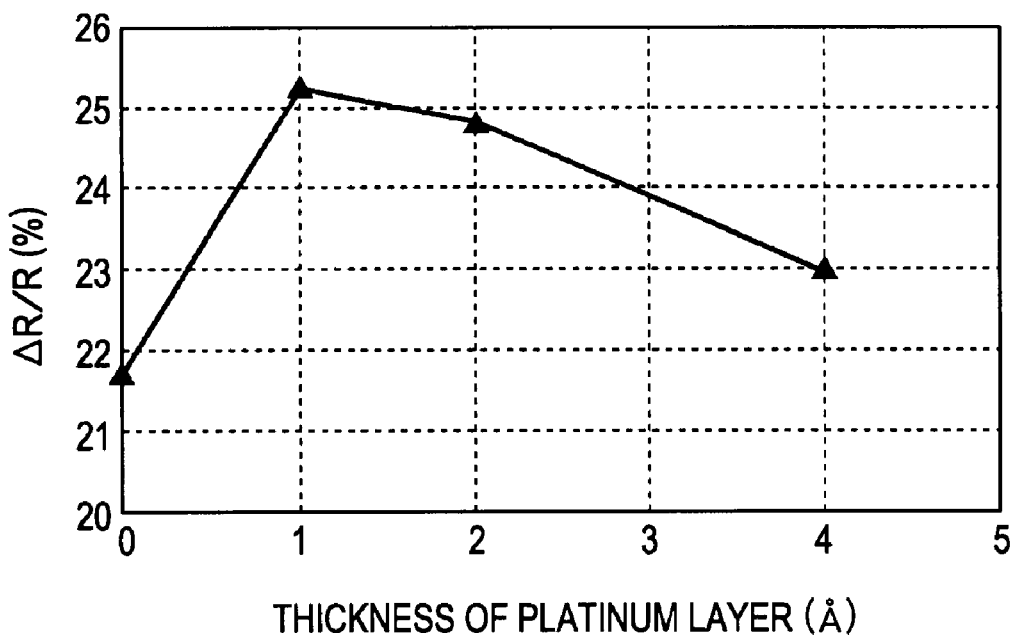
FIG. 13 is a graph showing the relationship between the rate of resistance change (ΔR/R) and the thickness of platinum layers formed between insulating barrier layers and pinned magnetic layers.

According to FIG. 13, the samples of the examples of the present invention had higher rates of resistance change ($\Delta R/R$) than the sample of the comparative example. That is, the samples of the examples of the present invention could provide higher rates of resistance change ($\Delta R/R$) than the sample of the comparative example (known tunneling magnetic sensor) at low RA comparable to that of the sample of the comparative example.

According to the experiment results shown in FIGS. 12 and 13, the platinum layer 10 preferably has a thickness of more than about 0 Å to 4 Å, more preferably about 0.4 to 2 Å, still more preferably about 1 to 2 Å.

Next, tunneling magnetic sensors shown in FIG. 1 were produced as samples. The basic film structure of the samples included, from bottom to top, the base layer 1, the seed layer 2, the antiferromagnetic layer 3, the pinned magnetic layer 4, the insulating barrier layer 5, the free magnetic layer 8, and a protective layer. The base layer 1 was formed of tantalum and had an average thickness of about 30 Å. The seed layer 2 was formed of NiFeCr and had an average thickness of about 50 Å. The antiferromagnetic layer 3 was formed of IrMn and had an average thickness of about 70 Å. The first pinned magnetic layer 4a was formed of $Co_{70at\%}Fe_{30at\%}$ and had an average thickness of about 14 Å. The nonmagnetic intermediate layer 4b was formed of ruthenium and had an average thickness of about 9.1 Å. The second pinned magnetic layer 4c was formed of CoFe and had an average thickness of about 18 Å. The enhancement layer 6 was formed of $Co_{10at\%}Fe_{90at\%}$ and had an average thickness of about 10 Å. The soft magnetic layer 7 was formed of $Ni_{86at\%}Fe_{14at\%}$ and had an average thickness of about 50 Å. The protective layer included a ruthenium layer having an average thickness of about 10 Å and a tantalum layer having an average thickness of about 165 Å.

In Table 3, Example 6 differs from Example 5 in that the second pinned magnetic layer 4c was formed of $Co_{70at\%}Fe_{30at\%}$ (about 18 Å).

Example 7 differs from Example 5 in that the platinum layer 10 was also formed between the enhancement layer 6 and the soft magnetic layer 7.

Example 8 differs from Example 5 in that the insulating barrier layer 5 was formed of Ti—Mg—O. The Ti—Mg—O insulating barrier layer 5 was formed by forming multilayer structures of titanium and magnesium layers as metal layers and oxidizing the titanium and magnesium layers.

In each example, a surface of the second pinned magnetic layer 4c was subjected to plasma treatment.

The above basic film structure was subjected to heat treatment at about 240° C. to 300° C. for about four hours.

According to Table 3, the samples of Examples 5 to 8 could provide higher rates of resistance change. ($\Delta R/R$) than the sample of Comparative Example 3 at low RA comparable to that of the sample of Comparative Example 3.

In the examples, where the platinum layer 10 was formed, the cohesive force (Hc) of the free magnetic layer 8 and the interlayer coupling field (Hin) between the free magnetic layer 8 and the pinned magnetic layer 4 were similar to those in Comparative Example 3.

What is claimed is:

1. A tunneling magnetic sensor comprising, from bottom to top:
   a first magnetic layer;
   an insulating barrier layer that comprises titanium oxide (Ti—O); and
   a second magnetic layer,
   wherein one of the first and second magnetic layers is a pinned magnetic layer whose magnetization direction is fixed and the other magnetic layer is a free magnetic layer whose magnetization direction is changed by an external magnetic field,
   wherein the free magnetic layer comprises a soft magnetic layer and an enhancement layer that is disposed between the soft magnetic layer and the insulating barrier layer, and
   wherein a platinum layer is disposed in at least one of positions between the insulating barrier layer and the first magnetic layer, between the insulating barrier layer and the second magnetic layer, and between the soft magnetic layer and the enhancement layer.

2. The tunneling magnetic sensor according to claim 1, wherein the platinum layer is disposed at least between the insulating barrier layer and the first magnetic layer.

3. The tunneling magnetic sensor according to claim 1, wherein the platinum layer has a thickness of more than about 0 Å to 4 Å.

4. The tunneling magnetic sensor according to claim 3, wherein the platinum layer has a thickness of about 0.4 to 2 Å.

TABLE 3

| No. | Second pinned magnetic layer (Å) | Platinum layer (Å) | Ti (Å) | Mg (Å) | Ti (Å) | Mg (Å) | Enhancement layer (Å) | Platinum layer (Å) | Soft magnetic layer (Å) | RA ($\Omega cm^2$) | $\Delta R/A$ (%) | Hc (Oe) | Hin (Oe) |
|---|---|---|---|---|---|---|---|---|---|---|---|---|---|
| Comparative Example 3 | $Co_{90}Fe_{10}$ (18) | Not formed | 5.6 | — | — | — | $Co_{10}Fe_{90}$ (10) | なし | $Ni_{86}Fe_{14}$ (50) | 2.02 | 23.90 | 3.1 | 18.3 |
| Example 5 | $Co_{90}Fe_{10}$ (18) | Formed (2) | 5.6 | — | — | — | $Co_{10}Fe_{90}$ (10) | なし | $Ni_{86}Fe_{14}$ (50) | 2.21 | 27.66 | 3.3 | 17.3 |
| Example 6 | $Co_{70}Fe_{30}$ (18) | Formed (2) | 5.6 | — | — | — | $Co_{10}Fe_{90}$ (10) | なし | $Ni_{86}Fe_{14}$ (50) | 1.99 | 26.22 | 3.6 | 19.7 |
| Example 7 | $Co_{90}Fe_{10}$ (18) | Formed (2) | 5.6 | — | — | — | $Co_{10}Fe_{90}$ (10) | あり(4) | $Ni_{86}Fe_{14}$ (50) | 2.21 | 25.03 | — | — |
| Example 8 | $Co_{90}Fe_{10}$ (18) | Formed (2) | — | 0.3 | 5.0 | 0.3 | $Co_{10}Fe_{90}$ (10) | なし | $Ni_{86}Fe_{14}$ (50) | 2.08 | 27.52 | — | — |

5. The tunneling magnetic sensor according to claim 1, wherein interdiffusion of constituent elements at interfaces between the platinum layer and the upper and lower layers facing each other with the platinum layer disposed therebetween forms such a concentration gradient that the platinum concentration decreases gradually from inside the platinum layer to inside the upper and lower layers.

6. The tunneling magnetic sensor according to claim 1, wherein the first magnetic layer is the pinned magnetic layer and the second magnetic layer is the free magnetic layer.

7. The tunneling magnetic sensor according to claim 1, wherein the enhancement layer comprises a CoFe alloy and the soft magnetic layer comprises a NiFe alloy.

8. A tunneling magnetic sensor comprising, from bottom to top:
- a first magnetic layer;
- an insulating barrier layer that comprises titanium magnesium oxide (Ti—Mg—O); and
- a second magnetic layer,
- wherein one of the first and second magnetic layers is a pinned magnetic layer whose magnetization direction is fixed and the other magnetic layer is a free magnetic layer whose magnetization direction is changed by an external magnetic field,
- wherein the free magnetic layer comprises a soft magnetic layer and an enhancement layer that is disposed between the soft magnetic layer and the insulating barrier layer, and
- wherein a platinum layer is disposed in at least one of positions between the insulating barrier layer and the first magnetic layer, between the insulating barrier layer and the second magnetic layer, and between the soft magnetic layer and the enhancement layer.

9. A method for producing a tunneling magnetic sensor that comprises, from bottom to top, a first magnetic layer, an insulating barrier layer that comprises titanium oxide (Ti—O), and a second magnetic layer, wherein one of the first and second magnetic layers is a pinned magnetic layer whose magnetization direction is fixed and the other magnetic layer is a free magnetic layer whose magnetization direction is changed by an external magnetic field, the free magnetic layer comprising a soft magnetic layer and an enhancement layer that is disposed between the soft magnetic layer and the insulating barrier layer, the method comprising:
- (a) forming the first magnetic layer;
- (b) forming the insulating barrier layer on the first magnetic layer;
- (c) forming the second magnetic layer on the insulating barrier layer; and
- (d) forming a platinum layer in at least one of positions between the first magnetic layer and the insulating barrier layer, between the insulating barrier layer and the second magnetic layer, and between the soft magnetic layer and the enhancement layer.

10. The method for producing the tunneling magnetic sensor according to claim 9, further comprising the step of subjecting a surface of the first magnetic layer to plasma treatment between the steps (a) and (b), wherein the step (d) is performed after the plasma treatment if the platinum layer is formed between the first magnetic layer and the insulating barrier layer.

11. The method for producing the tunneling magnetic sensor according to claim 9, wherein the platinum layer is formed to a thickness of more than about 0 Å to 4 Å.

12. The method for producing the tunneling magnetic sensor according to claim 11, wherein the platinum layer is formed to a thickness of about 0.4 to 2 Å.

13. A method for producing a tunneling magnetic sensor that comprises, from bottom to top, a first magnetic layer, an insulating barrier layer that comprises titanium magnesium oxide (Ti—Mg—O), and a second magnetic layer, wherein one of the first and second magnetic layers is a pinned magnetic layer whose magnetization direction is fixed and the other magnetic layer is a free magnetic layer whose magnetization direction is changed by an external magnetic field, the free magnetic layer comprising a soft magnetic layer and an enhancement layer that is disposed between the soft magnetic layer and the insulating barrier layer, the method comprising:
- (a) forming the first magnetic layer;
- (b) forming the insulating barrier layer on the first magnetic layer;
- (c) forming the second magnetic layer on the insulating barrier layer; and
- (d) forming a platinum layer in at least one of positions between the first magnetic layer and the insulating barrier layer, between the insulating barrier layer and the second magnetic layer, and between the soft magnetic layer and the enhancement layer.

* * * * *